United States Patent
Staines

(10) Patent No.: US 7,795,758 B2
(45) Date of Patent: Sep. 14, 2010

(54) METHOD AND DEVICE FOR PRODUCTION AND EMISSION OF A HIGH-POWER MICROWAVE PULSE

(75) Inventor: Geoffrey Staines, San Diego, CA (US)

(73) Assignee: Diehl BGT Defence GmbH & Co. KG, Überlingen (DE)

( * ) Notice: Subject to any disclaimer, the term of this patent is extended or adjusted under 35 U.S.C. 154(b) by 434 days.

(21) Appl. No.: 11/779,916

(22) Filed: Jul. 19, 2007

(65) Prior Publication Data
US 2008/0191559 A1  Aug. 14, 2008

(30) Foreign Application Priority Data
Jul. 19, 2006  (DE) .................. 10 2006 033 374

(51) Int. Cl.
*H03K 3/00* (2006.01)
(52) U.S. Cl. .................. 307/108; 307/109; 307/110
(58) Field of Classification Search .................. 307/108, 307/109, 110
See application file for complete search history.

(56) References Cited

U.S. PATENT DOCUMENTS

| | | | |
|---|---|---|---|
| 3,011,051 A | 11/1961 | Landecker | |
| 3,454,823 A * | 7/1969 | Werner et al. | 315/36 |
| 3,845,322 A | 10/1974 | Aslin | |
| 4,070,636 A | 1/1978 | Van Etten | |
| 5,798,579 A * | 8/1998 | McPhee | 307/106 |
| 7,474,017 B2 * | 1/2009 | Mayes | 307/108 |
| 2005/0285447 A1 | 12/2005 | Mayes et al. | |

FOREIGN PATENT DOCUMENTS

| | | |
|---|---|---|
| DE | 1 03 19 475 A1 | 12/2004 |
| DE | 102004020342 A1 | 11/2005 |

* cited by examiner

*Primary Examiner*—Albert W Paladini
*Assistant Examiner*—Hal I Kaplan
(74) *Attorney, Agent, or Firm*—Scully, Scott, Murphy & Presser, PC

(57) ABSTRACT

The production and emission of high-energy microwave pulses are made possible by means of a device with a particularly compact design if the capacitor column (12-12) of the Marx generator (11) whose series circuit conventionally itself feeds a microwave generator with a matched antenna geometry, is now itself used—dispensing with the microwave generator and its antenna—directly as a resonator and Hertzian antenna dipole (24). Its oscillation response can be optimized by triggered spark gaps (14) for the switching of capacitors (12), and by means of plates (19) connected at the ends, in order to increase the stray capacitances.

5 Claims, 2 Drawing Sheets

METHOD AND DEVICE FOR PRODUCTION AND EMISSION OF A HIGH-POWER MICROWAVE PULSE

BACKGROUND OF THE INVENTION

1. Field of the Invention

The invention relates to a method for the production and emission of a high-power microwave pulse. Furthermore, the invention provides for a device for the production and emission of a high-power microwave pulse.

For example, DE 1 03 19 475 A1 describes a generator for production and emission of pulsed energy in the microwave spectrum (generally referred to as HPM=High Power Microwaves), whose energy density with a broader bandwidth is suitable for at least adversely affecting radio traffic being operated in the vicinity and, in particular, for interfering with the input side, or even destroying, electronic circuits. For this purpose, the microwave generator uses an antenna structure that is matched to it to emit pulsed energy. The microwave generator is energized from a charging circuit with an electrical power source, in the case of mobile appliances a rechargeable battery, and with an electronic voltage converter via a Marx pulsed-voltage generator as is described in more detail, for example, in DE 10 2004 020 342 A1. Its operation is based on a stack of capacitors being charged in parallel, which are then discharged via a load having been connected in series, with the load being the microwave generator. Switching to series connection for voltage multiplication based on the number of capacitors previously charged in parallel in the Marx pulsed-voltage generator is carried out by spark gaps responding and igniting. From the hardware point of view, an HPM device such as this which can be operated autonomously can be accommodated in a container of the same order of magnitude as a relatively large briefcase, in which the charging circuit, the Marx pulsed-voltage generator to be charged from it and the microwave generator fed therefrom together with a flange-connected antenna cone are arranged alongside one another in three hardware groups of approximately the same size.

SUMMARY OF THE INVENTION

The present invention is based on the technical problem of specifying a method and a device of this generic type which require considerably less space and circuitry in approximately the same HPM power spectrum.

This object is achieved by the present disclosure in that any microwave generator connected downstream from the Marx pulsed-voltage generator and with an antenna for production and emission of pulsed energy is completely dispensed with, and, instead of this, the microwave energy is now produced and emitted by the Marx pulsed-voltage generator itself, which for this purpose acts as a resonator and capacitively-fed Hertzian dipole with large stray capacitances. This saves the complexity for production of a separate microwave generator fitted with an antenna, with its additional spark gaps, thus reducing the space required for the hardware to about two thirds of that previously required.

The Marx pulsed-voltage generator will be referred to in the following text simply as a Marx generator, following the normal practice. In order to allow this Marx generator itself to be used as effectively as possible as a microwave emitter, its cascade of Marx capacitors is formed using comparatively small capacitors, in the interest of short charging-time constants, and the effective output capacitance of the charging circuit is in contrast kept small, for example in the region of the order of magnitude of 2% (specifically typically about 20 pF for Marx capacitors in the order of magnitude of 1000 pF each).

The stray capacitance, which is unavoidable in any case but is required here for the oscillation response, of the Marx generator is expediently artificially increased by means of electrically conductive plates at the two ends of the capacitor column. A plate diameter of 20 cm in this case results in an increase in the stray capacitance of the Marx generator of about 10 pF.

A further improvement in the radio-frequency oscillation response of a Marx generator used directly as a microwave generator according to the invention results from a reduction in the charging resistances upstream of the individual Marx capacitors, because this speeds up the process of discharging the series circuit. Because only small currents flow here, commercially available electrically conductive plastics, which can be mechanically highly loaded, can be used by preference as resistors which are resistant to high voltages.

The use of externally triggerable spark-gap switches for each of the capacitor stages in the Marx generator is particularly advantageous for an oscillation response which starts steeply. This avoids one spark gap being triggered only when the preceding stage in the capacitor column has been triggered, which would typically lead to a switching delay of approximately 1 ns per stage. The central triggering of all of the spark-gap switches at the same time in contrast ensures that, because of the simultaneous switching of all of the capacitor stages of parallel charging to series discharging, there is virtually no loss of charge over their individual charging resistors, but the entire voltage from the series circuit of all of the capacitor stages with the respective triggered spark gaps located between them is now actually directly available for excitation of the radio-frequency resonance effect across the capacitor columns, and this leads to the emission of a steeply rising, high-energy microwave pulse directly from the Marx generator.

In this context, it is particularly expedient to use spark-gap switches which each have a third electrode as the trigger electrode. These trigger electrodes can all be interconnected and can be connected via a series resistance to earth potential, while the capacitor stack is charged in a bipolar form (balanced with respect to earth potential). When the first of the spark gaps is triggered, the trigger electrodes on all of the other spark gaps are therefore at one of the two charge potentials with respect to earth potential so that they are therefore all triggered immediately. The greater the number of such switching processes that have already taken place, the greater is the potential difference across the switching gaps that still remain, so that these now respond even more reliably, and are triggered more quickly.

The electrically interconnected trigger electrodes may, however, also all be driven jointly from a high-voltage pulse generator which is operated especially for this purpose. When the trigger electrodes are connected in series, its trigger pulse would pass over the entire length of the stack of capacitors that have just been charged in order now to discharge them in series, but with a delay time in the order of magnitude of typically one nanosecond over a path length in the order of magnitude of 30 cm. The switching synchronicity can therefore be improved further if the trigger pulses are fed in more than once, symmetrically, to the trigger electrodes so that the effective delay times of the trigger pulses are significantly shortened by fanning them out directly to the spark gaps.

In any case, according to the invention, the high-energy microwave pulses can now be produced and emitted by means of a considerably more compact device since the Marx generator, with its capacitor column which conventionally itself feeds a microwave generator with a matched antenna geometry is itself also used directly as a resonator and at the same time as a Hertzian antenna dipole for emission of the high-power microwave pulses, dispensing with the microwave generator and its antenna. In particular, the oscillation response of the Marx generator can be optimized from the hardware point of view by means of triggered spark gaps for the switching for discharging of the capacitors and by end plates in order to increase the stray capacitances of the capacitor arrangement.

BRIEF DESCRIPTION OF THE DRAWING

Additional developments and alternatives of the invention can be found in the following description of one preferred implementation example of the solution according to the invention, which is illustrated in an abstract form in the drawing, which is not to scale, and which is restricted to what is functionally essential.

DETAILED DESCRIPTION OF THE INVENTION

Figure 1:
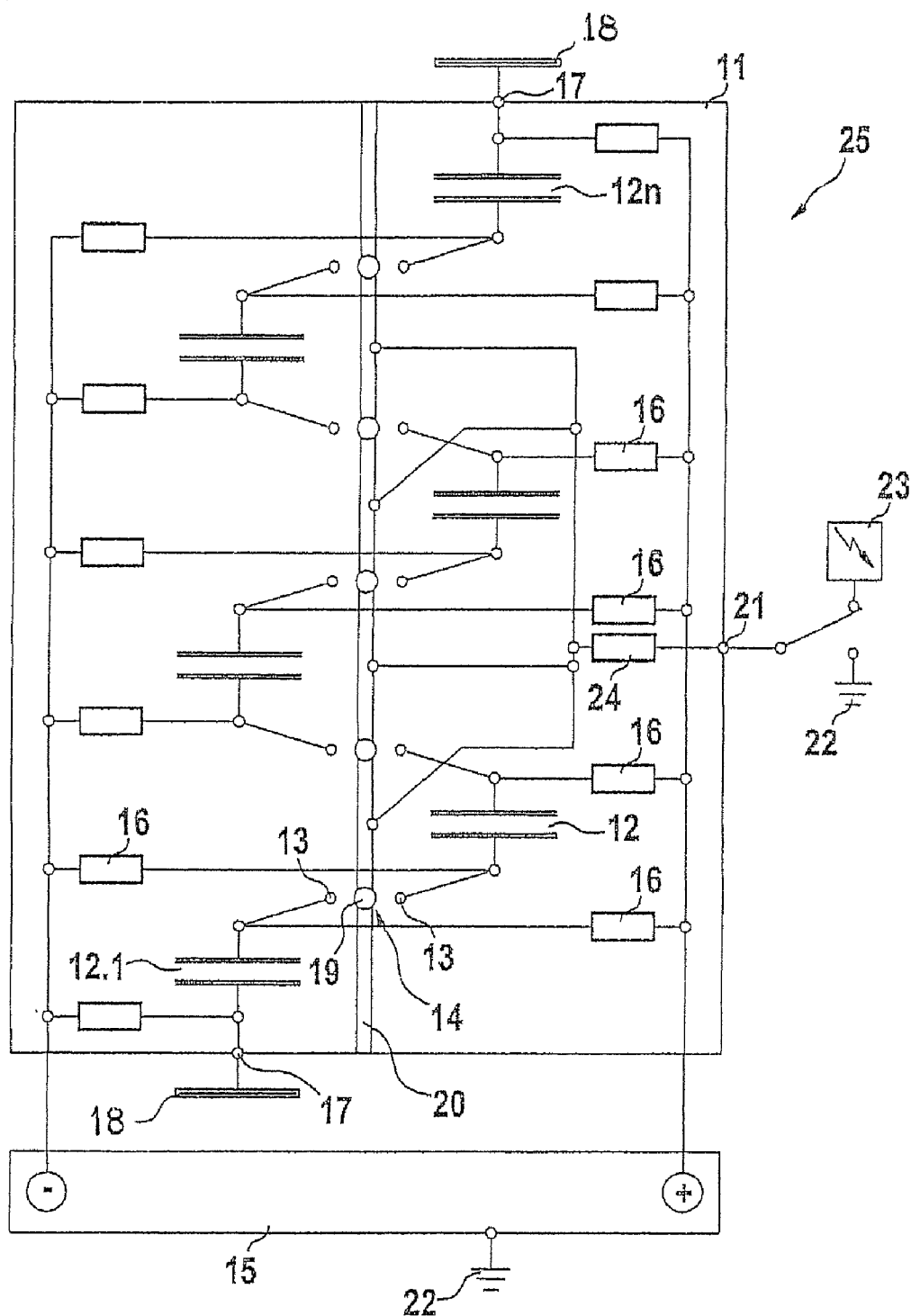
FIGS. 1 and 2 of the drawings show the basic design of a Marx generator in two operative conditions which emits directly as a microwave generator, in the form of a circuit diagram.

The Marx pulsed-voltage generator which is referred to in the following text here for the sake of simplicity as a Marx generator 11, has a column comprising n relatively large-volume capacitors 12 (12.1 to 12.$n$), which, in the interest of high-density design are stacked, as shown in the sketch, offset laterally with a gap in a zigzag form to form a short column. A high-voltage switch, in the form of the two electrodes 13-13, which must be oriented with respect to one another, of a spark gap 14 is connected in series with in each case two mutually associated capacitors 12-12.

The capacitors 12 are each charged in parallel from a direct-current charging circuit 15 with a preferably bipolar high voltage in the order of magnitude of several tens of kilovolt, with a charging current in the order of magnitude of one milliampere. Each capacitor 12 is preceded by a respective decoupling resistor 16 in each of its two charging paths, preventing short-circuits via these charging paths when the spark gap 14 to the adjacent capacitor 12 is triggered.

Plates 18 composed of electrically conductive material, or with a conductive coating, are connected to the outputs 17 on the end faces of the generator 11 with its capacitor column 12-12, in order to increase the stray capacity of the generator 11 and, in contrast to the basic illustration, can also be arranged in an isolated form directly on the end surfaces of the housing of the Marx generator 11.

Thirdly, all of the spark gaps 14 have between their electrodes 13-13 a trigger electrode 19 as a third electrode in order to assist the triggering of the respective spark gap 14, thus ensuring that the series discharge takes place a simultaneously as possible over all of the capacitor stages 12-12. The spark gaps 14 are preferably positioned in the generator 11 such that the trigger electrodes 19 all lie on one plane. They can therefore be mechanically held, in a pattern which geometrically corresponds to the mechanical configuration of the spark gaps 14, in a thin board 20 composed of electrically (even if only slightly) plastic, and are thus at the same time electrically conductively connected to one another. This high-impedance interconnection of the trigger electrodes 19 prevents short-circuits between the capacitors 12 via the trigger electrodes 19 of the triggered spark gaps 14.

This means, for the installation and connection of all of the trigger electrodes 19, that only this board 20 need be arranged in the interior of the generator 11, so that the electrodes 13-13, with their respectively connected capacitors 12, can be located alternately on both sides of one of the trigger electrodes 19 in the board 20. In the interests of the pulse delay times to the individual trigger electrodes 19 all being the same, one trigger input 21 is spatially symmetrically connected a plurality of times to the board 20, as is shown symbolically in the drawing.

Figure 2:
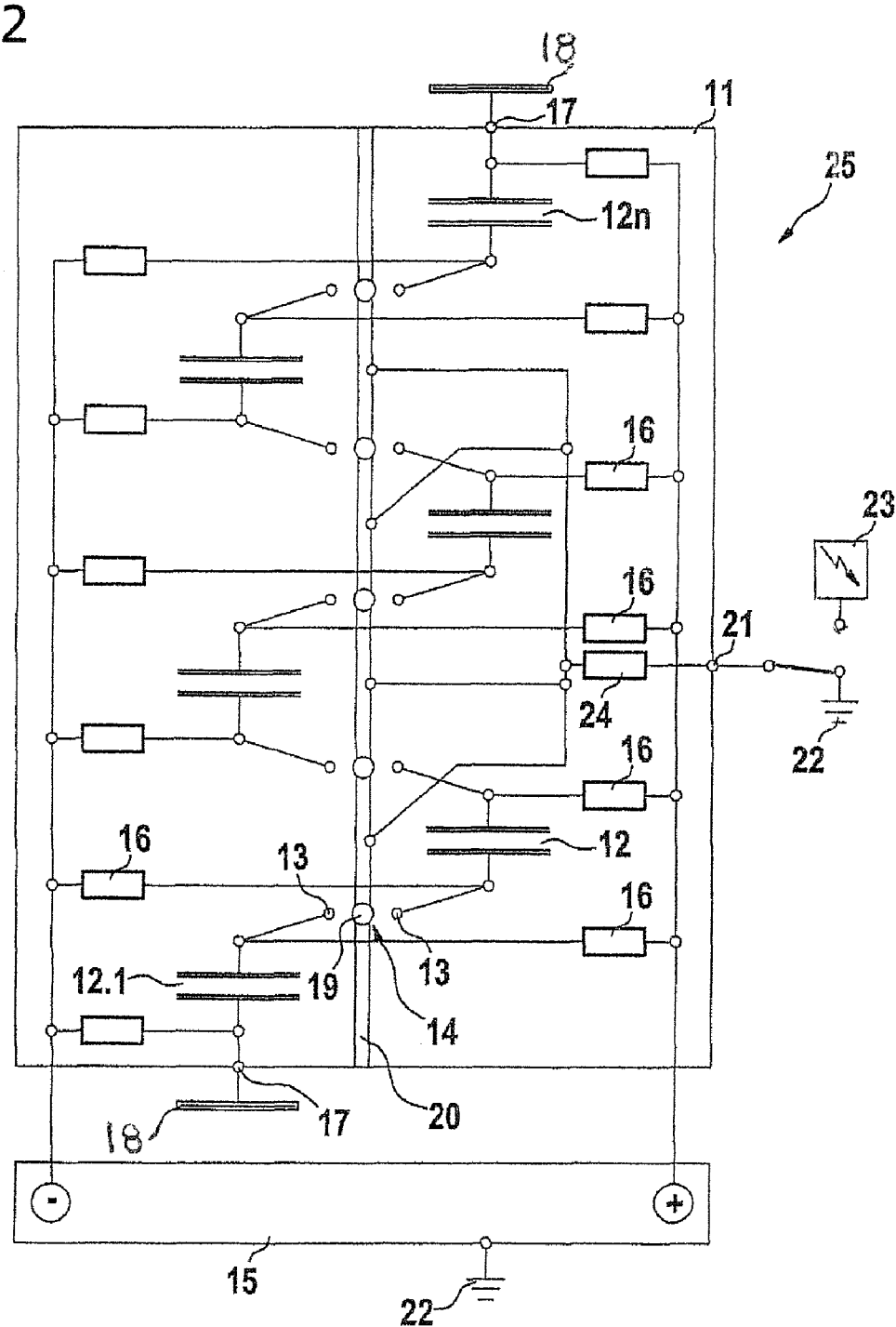

As explained above, the trigger input 21 can be connected to earth potential 22 (as shown in FIG. 2) or to a trigger generator 23 (as shown in FIG. 1). A decoupling resistor 24 from the circuitry and carrier board 20 to the trigger input 21 supplies the capacitive time constant, which prevents significant discharging of the capacitors 12 via the trigger electrodes 19 to earth potential 22, or into the trigger generator 23, before the HPM pulse has been built up and emitted.

The triggers of the spark gaps 14 therefore result in the n capacitors 12 (12.1 to 12.$n$), which were previously charged in parallel, all being electrically connected in series, as a result of which (virtually) n-times the charging voltage from the charging circuit 15 oscillates between the outputs 17-17 and the plates 18 connected here, as a result of which the Marx generator 11 emits a high-power microwave pulse directly, acting as a resonator and a Hertzian antenna dipole 25.

LIST OF REFERENCE SYMBOLS

11 Marx generator (with 14 between 12-12)
12 Capacitors, quantity n, stacked (12.1 to 12.$n$)
13 Electrodes (of 14)
14 Spark gaps (between 12-12)
15 Charging circuit (for 12, in parallel)
16 Decoupling resistors (upstream of 12)
17 Outputs (of 11)
18 Electrically conductive plates (at 17)
19 Trigger electrodes (between 13-13 of 14)
20 Electrically conductive board (for 19)
21 Trigger input (for 19)
22 Earth potential (at 21)
24 Decoupling resistor (between 20 and 21)
23 Trigger generator (at 21)
25 Antenna dipole (in the form of 11)

What is claimed is:

1. A device for the production and emission of a high-power microwave pulse, wherein a Marx generator (11), is equipped with capacitors (12) which are charged in parallel from a charging circuit (15), said capacitors are connectable in series via electrodes (13) from spark gaps (14), wherein said Marx generator serves directly as a resonator and antenna dipole; and wherein the capacitors (12) each are connected to the charging circuit (15) via decoupling resistors (16).

2. A device for the production and emission of a high-power microwave pulse, wherein a Marx generator (11), is equipped with capacitors (12) which are charged in parallel from a charging circuit (15), said capacitors are connectable in series via electrodes (13) from spark gaps (14), wherein said Marx generator services directly as a resonator and antenna dipole, wherein the spark gaps (14) are equipped with trigger electrodes (19) which are commonly connected to a high-voltage trigger generator (23), and wherein the trigger electrodes (19) are arranged on a board (20) which is composed of an electrically conductive plastic and is retained in the Marx generator (11) between the spark-gap electrodes (13-13).

3. A device for the production and emission of a high-power microwave pulse, wherein a Marx generator (11), is equipped with capacitors (12) which are charged in parallel from a charging circuit (15), said capacitors are connectable in series via electrodes (13) from spark gaps (14), wherein said Marx generator serves directly as a resonator and antenna dipole, and wherein the Marx generator (11) at each end thereof is equipped with electrically conductive plates (18) which are connected to a stack of said capacitors (12).

4. A device for the production and emission of a high-power microwave pulse, wherein a Marx generator (11), is equipped with capacitors (12) which are charged in parallel from a bipolar high-voltage charging circuit (15), said capacitors are connectable in series via electrodes (13) from spark gaps (14), wherein said Marx generator serves directly as a resonator and antenna dipole, wherein the spark gaps (14) are equipped with trigger electrodes (19) which are commonly connected to earth potential (22) via a decoupling resistor (24), and the capacitors (12) are connected in a parallel circuits to said bipolar high-voltage charging circuit (15), and wherein the trigger electrodes (19) are arranged on a board (20) which is composed of an electrically conductive plastic and is retained in the Marx generator (11) between the spark-gap electrodes (13-13).

5. A device according to any one of claims 1, 3, 4 and 2, wherein the capacitors (12) each have a capacitance in excess of any resultant stray capacitance of the Marx generator (11).

* * * * *